United States Patent
Osada et al.

(10) Patent No.: US 11,831,301 B2
(45) Date of Patent: Nov. 28, 2023

(54) FILTER DEVICE

(71) Applicant: Murata Manufacturing Co., Ltd., Nagaokakyo (JP)

(72) Inventors: Junji Osada, Nagaokakyo (JP); Norihiko Nakahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 442 days.

(21) Appl. No.: 17/322,983

(22) Filed: May 18, 2021

(65) Prior Publication Data
US 2021/0273633 A1    Sep. 2, 2021

Related U.S. Application Data

(63) Continuation of application No. PCT/JP2019/045254, filed on Nov. 19, 2019.

(30) Foreign Application Priority Data

Dec. 25, 2018  (JP) .................................. 2018-241300

(51) Int. Cl.
*H03H 9/64* (2006.01)
*H03H 7/01* (2006.01)
(Continued)

(52) U.S. Cl.
CPC ........ *H03H 9/6483* (2013.01); *H03H 7/0161* (2013.01); *H03H 9/25* (2013.01); *H03H 9/725* (2013.01)

(58) Field of Classification Search
CPC ...... H03H 9/6483; H03H 7/0161; H03H 9/25; H03H 9/725; H03H 9/02574; H03H 9/542; H03H 9/14538
See application file for complete search history.

(56) References Cited

U.S. PATENT DOCUMENTS 10,476,470 B2 * 11/2019 Takamine ............ H03H 9/6496
2008/0150652 A1    6/2008 Itou
(Continued)

FOREIGN PATENT DOCUMENTS

CN    103004085 A    3/2013
CN    107636961 A    1/2018
(Continued)

OTHER PUBLICATIONS

Official Communication issued in International Patent Application No. PCT/JP2019/045254 dated Feb. 10, 2020.
(Continued)

*Primary Examiner* — Andrea Lindgren Baltzell
*Assistant Examiner* — Kimberly E Glenn
(74) *Attorney, Agent, or Firm* — KEATING & BENNETT, LLP

(57) ABSTRACT

A filter device includes a common connection terminal, a first bandpass filter connected to the common connection terminal and including an inductor, and a second bandpass filter connected to the common connection terminal and having a pass band lower in frequency than a pass band of the first bandpass filter. The filter device uses SH waves. The first bandpass filter is a ladder filter. Each of series arm resonators and parallel arm resonators includes an interdigital transducer electrode. Of the parallel arm resonators of the first bandpass filter, the inductor is connected in series to the parallel arm resonator with a shortest electrode finger pitch of the interdigital transducer electrode.

20 Claims, 11 Drawing Sheets

(51) Int. Cl.
*H03H 9/25* (2006.01)
*H03H 9/72* (2006.01)

(56) References Cited

U.S. PATENT DOCUMENTS

| | | |
|---|---|---|
| 2013/0162368 A1 | 6/2013 | Tsurunari et al. |
| 2013/0285768 A1 | 10/2013 | Watanabe et al. |
| 2014/0203893 A1 | 7/2014 | Kando et al. |
| 2018/0102755 A1 | 4/2018 | Takamine |
| 2018/0254763 A1 | 9/2018 | Yamamoto et al. |
| 2020/0287523 A1 | 9/2020 | Urata |

FOREIGN PATENT DOCUMENTS

| | | |
|---|---|---|
| JP | 2008-160562 A | 7/2008 |
| JP | 2013-081068 A | 5/2013 |
| JP | 2015-073331 A | 4/2015 |
| JP | 2015-092782 A | 5/2015 |
| WO | 2017/038679 A1 | 3/2017 |
| WO | 2018/139598 A1 | 8/2018 |

OTHER PUBLICATIONS

Office Action in CN201980085485.X, dated Aug. 25, 2023, 15 pages.

* cited by examiner

FILTER DEVICE

CROSS REFERENCE TO RELATED APPLICATIONS

This application claims the benefit of priority to Japanese Patent Application No. 2018-241300 filed on Dec. 25, 2018 and is a Continuation Application of PCT Application No. PCT/JP2019/045254 filed on Nov. 19, 2019. The entire contents of each application are hereby incorporated herein by reference.

BACKGROUND OF THE INVENTION

1. Field of the Invention

The present invention relates to filter devices.

2. Description of the Related Art

In general, a filter device such as a multiplexer, in which a plurality of bandpass filters are connected in common to an input/output terminal, or any other similar device is widely used in mobile phones and the like. As an example of such filter devices, Japanese Unexamined Patent Application Publication No. 2013-081068 discloses a demultiplexer in which a ladder bandpass filter and a multimode coupling bandpass filter are connected in common to an input/output terminal. Each of series arm resonators and parallel arm resonators of the ladder bandpass filter is an acoustic wave resonator.

In the case where shear horizontal (SH) waves are used as a major mode of a bandpass filter, there is a response caused by a Rayleigh wave, which is an unwanted wave, in the acoustic wave resonator of the bandpass filter. In the case where a plurality of bandpass filters are connected in common to an input/output terminal as in Japanese Unexamined Patent Application Publication No. 2013-081068, a response caused by the Rayleigh wave in one of the bandpass filters may sometimes occur in a pass band of another bandpass filter. In such case, a ripple occurs in the pass band of the bandpass filter connected in common. This increases the insertion loss and degrades the filter characteristics.

Particularly, in the case where a piezoelectric substrate on which acoustic wave resonators of bandpass filters are provided has a multilayer structure including a high acoustic velocity layer and a piezoelectric layer, the ripple caused by the Rayleigh wave become larger, and the filter characteristics degrades substantially. Even if one tries to reduce or prevent the response caused by the Rayleigh wave, the filter characteristics of the bandpass filter itself, in which the response caused by the Rayleigh wave occurs, may be at risk of degradation.

SUMMARY OF THE INVENTION

Preferred embodiments of the present invention provide filter devices each with excellent filter characteristics and able to reduce or prevent an effect of a response caused by a Rayleigh wave on a pass band of one of bandpass filters connected in common without causing degradation of filter characteristics of another of the bandpass filters connected in common.

A filter device according to a preferred embodiment of the present invention includes a common connection terminal; a first bandpass filter connected to the common connection terminal, the first bandpass filter including a piezoelectric substrate, a plurality of acoustic wave resonators on the piezoelectric substrate, and an inductor; and a second bandpass filter connected to the common connection terminal, a pass band of the second bandpass filter being lower in frequency than a pass band of the first bandpass filter, wherein an SH wave is used, the first bandpass filter is a ladder filter including a series arm resonator and a plurality of parallel arm resonators, each of the series arm resonator and the plurality of parallel arm resonators being an acoustic wave resonator including an interdigital transducer electrode, and of the plurality of parallel arm resonators of the first bandpass filter, the inductor is connected in series to the parallel arm resonator having a shortest electrode finger pitch of the interdigital transducer electrode.

A filter device according to a preferred embodiment of the present invention includes a common connection terminal; a first bandpass filter connected to the common connection terminal, the first bandpass filter including a piezoelectric substrate, a plurality of acoustic wave resonators on the piezoelectric substrate, and an inductor; and a second bandpass filter connected to the common connection terminal, a pass band of the second bandpass filter being lower in frequency than a pass band of the first bandpass filter, wherein the piezoelectric substrate includes a lithium tantalate layer in which θ of Euler angles ($\phi$, $\theta$, $\psi$) is about −54° to about −42°, the first bandpass filter is a ladder filter including a series arm resonator and a plurality of parallel arm resonators, each of the series arm resonator and the plurality of parallel arm resonators being an acoustic wave resonator including an interdigital transducer electrode, and of the plurality of parallel arm resonators of the first bandpass filter, the inductor is connected in series to the parallel arm resonator having a shortest electrode finger pitch of the interdigital transducer electrode.

A filter device according to a preferred embodiment of the present invention includes a common connection terminal; a first bandpass filter connected to the common connection terminal, the first bandpass filter including a piezoelectric substrate, a plurality of acoustic wave resonators on the piezoelectric substrate, and an inductor; and a second bandpass filter connected to the common connection terminal, a pass band of the second bandpass filter being lower in frequency than a pass band of the first bandpass filter, wherein a SH wave is used, the first bandpass filter is a ladder filter including a parallel arm resonator and a plurality of series arm resonators, each of the plurality of series arm resonators and the parallel arm resonator being an acoustic wave resonator including an interdigital transducer electrode, and of the plurality of series arm resonators of the first bandpass filter, the inductor is connected in series to a common connection terminal side of the series arm resonator having a shortest electrode finger pitch of the interdigital transducer electrode.

A filter device according to a preferred embodiment of the present invention includes a common connection terminal; a first bandpass filter connected to the common connection terminal, the first bandpass filter including a piezoelectric substrate, a plurality of acoustic wave resonators on the piezoelectric substrate, and an inductor; and a second bandpass filter connected to the common connection terminal, a pass band of the second bandpass filter being lower in frequency than a pass band of the first bandpass filter, wherein the piezoelectric substrate includes a lithium tantalate layer in which θ of Euler angles ($\phi$, $\theta$, $\psi$) is about −54° to about −42°, the first bandpass filter is a ladder filter including a parallel arm resonator and a plurality of series arm resonators, each of the plurality of series arm resonators and the parallel arm resonator being an acoustic wave resonator including an interdigital transducer electrode, and of the plurality of series arm resonators of the first bandpass filter, the inductor is connected in series to a common connection terminal side of the series arm resonator having a shortest electrode finger pitch of the interdigital transducer electrode.

Preferred embodiments of the present invention provide filter devices having excellent filter characteristics that each are able to reduce or prevent an effect of a response caused by a Rayleigh wave on a pass band of one of bandpass filters connected in common without causing degradation of filter characteristics of another of the bandpass filters connected in common.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention is disclosed in detail below by describing preferred embodiments of the present invention with reference to the drawings.

Each preferred embodiment described in the present specification is for illustrative purposes only and elements of different preferred embodiments may be partially exchanged or combined.

Figure 1:
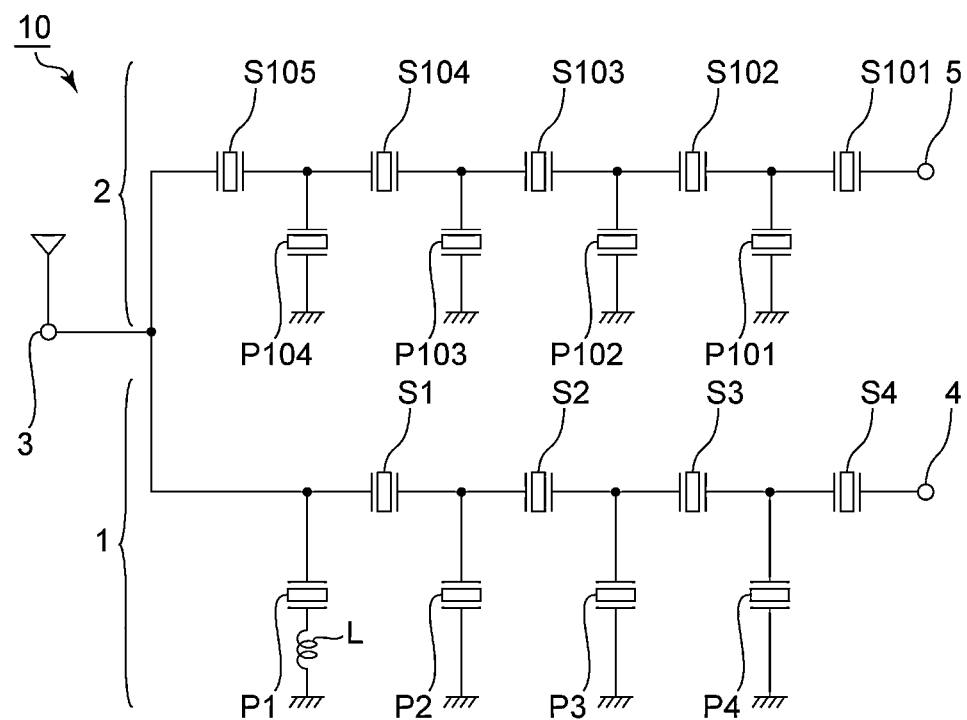
FIG. 1 is a circuit diagram of a filter device according to a first preferred embodiment of the present invention.

FIG. 1 is a circuit diagram of a filter device according to a first preferred embodiment of the present invention.

A filter device 10 includes a common connection terminal 3, a first bandpass filter 1, and a second bandpass filter 2. The first and second bandpass filters 1 and 2 are connected in common to the common connection terminal 3. A pass band of the second bandpass filter 2 is lower in frequency than a pass band of the first bandpass filter 1. In the present preferred embodiment, the common connection terminal 3 is an antenna terminal connected to an antenna. The filter device 10 is a duplexer, the first bandpass filter 1 is a reception filter, and the second bandpass filter 2 is a transmission filter.

Note that the first bandpass filter 1 and the second bandpass filter 2 may each be either a reception filter or a transmission filter. For example, the first bandpass filter 1 and the second bandpass filter 2 may both be reception filters. The filter device 10 may alternatively be a multiplexer in which three or more bandpass filters including the first bandpass filter 1 and the second bandpass filter 2 are connected in common to the common connection terminal 3.

As illustrated in FIG. 1, the first bandpass filter 1 is a ladder filter including a plurality of series arm resonators and a plurality of parallel arm resonators. Each of the plurality of series arm resonators and the plurality of parallel arm resonators is an acoustic wave resonator.

The first bandpass filter 1 is connected to the common connection terminal 3 and also connected to a first signal terminal 4 which is different from the common connection terminal 3. In between the common connection terminal 3 and the first signal terminal 4, a series arm resonator S1, a series arm resonator S2, a series arm resonator S3, and a series arm resonator S4 are connected in series to each other. Of the plurality of series arm resonators, the series arm resonator S1 is closest to the common connection terminal 3.

A parallel arm resonator P1 is connected between a ground potential and a connection point between the common connection terminal 3 and the series arm resonator S1. A parallel arm resonator P2 is connected between the ground potential and a connection point between the series arm resonator S1 and the series arm resonator S2. A parallel arm resonator P3 is connected between the ground potential and a connection point between the series arm resonator S2 and the series arm resonator S3. A parallel arm resonator P4 is connected between the ground potential and a connection point between the series arm resonator S3 and the series arm resonator S4. In the present preferred embodiment, the acoustic wave resonator closest to the common connection terminal 3 is the parallel arm resonator P1.

The first bandpass filter 1 includes an inductor L that is connected in series to the ground potential side of the parallel arm resonator P1. The inductor L may be, for example, a chip inductor, a wiring line on a filter chip, or a wiring line on a package.

On the other hand, the circuit configuration of the second bandpass filter 2 is not limited to a particular configuration, and in the present preferred embodiment, the second bandpass filter 2 is a ladder filter, for example. The second bandpass filter 2 is connected to the common connection terminal and also connected to a second signal terminal 5 which is different from the common connection terminal 3. In a series arm connecting the common connection terminal 3 and the second signal terminal 5, a series arm resonator S101, a series arm resonator S102, a series arm resonator S103, a series arm resonator S104, and a series arm resonator S105 are provided. In respective parallel arms connecting the ground potential and the respective connection points between the series arm resonators, a parallel arm resonator P101, a parallel arm resonator P102, a parallel arm resonator P103, and a parallel arm resonator P104 are provided. Note that the second bandpass filter 2 may alternatively be a longitudinally coupled resonator acoustic wave filter or the like, for example.

Here, the first bandpass filter includes a piezoelectric substrate 6. The plurality of acoustic wave resonators are provided on the piezoelectric substrate 6. The acoustic wave resonator of the first bandpass filter 1 is described below in detail.

Figure 2:
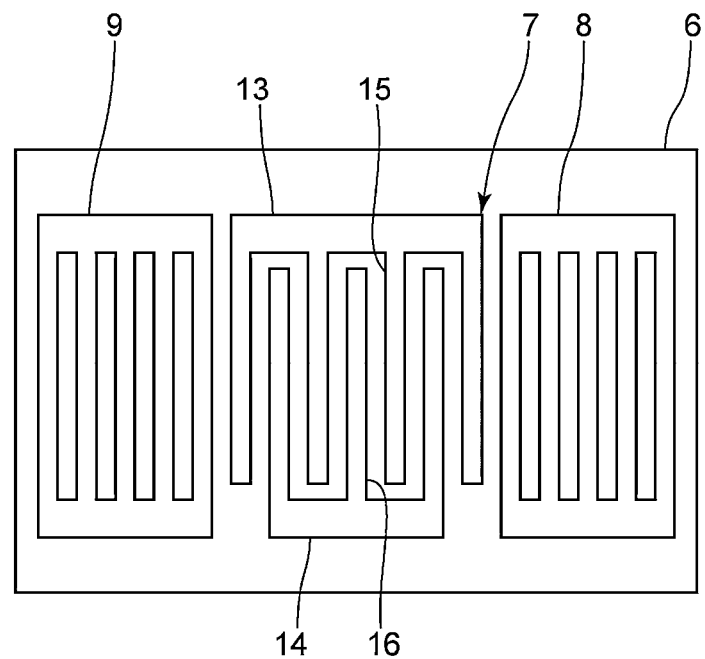
FIG. 2 is a plan view of an acoustic wave resonator of a first bandpass filter in the first preferred embodiment of the present invention.

FIG. 2 is a plan view of an acoustic wave resonator of the first bandpass filter in the first preferred embodiment. Note that the acoustic wave resonator illustrated in FIG. 2 is the parallel arm resonator P1 closest to the common connection terminal. In FIG. 2, wiring lines connected to the parallel arm resonator P1 are omitted.

The parallel arm resonator P1 includes the piezoelectric substrate 6 and an interdigital transducer electrode 7 provided on the piezoelectric substrate 6. An acoustic wave is excited by applying an alternating-current voltage to the interdigital transducer electrode 7. On the piezoelectric substrate 6, a pair of reflectors 8 and 9, are provided on two sides of the interdigital transducer electrode 7 in an acoustic wave propagation direction.

In the present preferred embodiment, the piezoelectric substrate 6 includes only a piezoelectric layer. More specifically, the piezoelectric substrate 6 is a lithium tantalate substrate, for example. However, the piezoelectric substrate 6 may alternatively be a multilayer body including a piezoelectric layer.

The interdigital transducer electrode 7 includes a first busbar 13 and a second busbar 14 that are opposite to each other. The interdigital transducer electrode 7 includes a plurality of first electrode fingers 15 each connected to the first busbar 13 at one end portion thereof. The interdigital transducer electrode 7 further includes a plurality of second electrode fingers 16 each connected to the second busbar 14 at one end portion thereof. The plurality of first electrode fingers 15 and the plurality of second electrode fingers 16 interdigitate with each other.

The interdigital transducer electrode 7 may be a multilayer metal film in which a plurality of metal layers are stacked on top of each other or may be a single layer metal film. Each of the reflectors 8 and 9 is also made of a material the same as or similar to the material of the interdigital transducer electrode 7.

Similarly, each of the acoustic wave resonators other than the parallel arm resonator P1 includes an interdigital transducer electrode and reflectors provided on the piezoelectric substrate 6. In the present preferred embodiment, of electrode finger pitches of interdigital transducer electrodes in the parallel arm resonators of the first bandpass filter 1, the electrode finger pitch of the interdigital transducer electrode 7 in the parallel arm resonator P1 closest to the common connection terminal 3 is the shortest. More specifically, the electrode finger pitch of the interdigital transducer electrode 7 in the parallel arm resonator P1 is shorter than any of the electrode finger pitches of the interdigital transducer electrodes in the other parallel arm resonators of the first bandpass filter 1. Note that the electrode finger pitch is the distance between the centers of adjacent electrode fingers. The inductor L is connected in series to the parallel arm resonator P1. The inductance of the inductor L is not limited to a particular value but is preferably set to about 1.5 nH, for example, in the present preferred embodiment.

In each of the acoustic wave resonators of the first bandpass filter 1, leaky waves that are SH surface waves are excited as a main mode. The filter device 10 of the present preferred embodiment uses leaky waves that are one type of SH waves. Note that in the first bandpass filter 1, a response caused by a Rayleigh wave, which is an unwanted wave, occurs.

The first bandpass filter 1 and the second bandpass filter 2 are provided in a same chip. In the present specification, the phrase "provided in a same chip" is defined to mean "provided on or in the same piezoelectric substrate 6". Note that the first bandpass filter 1 and the second bandpass filter 2 may alternatively be provided on or in different substrates.

A characteristic feature of the present preferred embodiment is that SH waves are used and, of the plurality of parallel arm resonators of the first bandpass filter 1, the inductor is connected in series to the parallel arm resonator P1 with the shortest electrode finger pitch of the interdigital transducer electrode. This enables reduction or prevention of an effect of the response caused by the Rayleigh wave on the pass band of the second bandpass filter 2 without causing degradation of the filter characteristics of the first bandpass filter 1. This will be described below by comparing the present preferred embodiment with first to third comparative examples.

The first comparative example is different from the first preferred embodiment in that no inductor is included and the electrode finger pitch of the interdigital transducer electrode in the parallel arm resonator closest to the common connection terminal is equal or substantially equal to the electrode finger pitches of the interdigital transducer electrodes in the other parallel arm resonators. The second comparative example is different from the first preferred embodiment in that the electrode finger pitch of the interdigital transducer electrode in the parallel arm resonator closest to the common connection terminal is equal or substantially equal to the electrode finger pitches of the interdigital transducer electrodes in the other parallel arm resonators. The third comparative example is different from the first preferred embodiment in that no inductor is included.

A filter device having the configuration of the first preferred embodiment and filter devices of the first to third comparative examples are respectively prepared. Conditions of the respective filter devices are as follows.

Communication band: Band 66
Pass band of first bandpass filter: about 2110 MHz to about 2200 MHz
Pass band of second bandpass filter: about 1710 MHz to about 1780 MHz
Material of piezoelectric substrate: Lithium tantalate (LiTaO$_3$)
Euler angles of piezoelectric substrate: (0°±5°, θ, 0°±5°), θ=about −54° to about −42°

Note that 0°±5° in the foregoing Euler angles represents an angle in the range from about −5° to about 5°. The inductances of the inductors in the first preferred embodiment and the second comparative example are each set to about 1.5 nH.

Design parameters of respective acoustic wave resonators of the first bandpass filters in the first preferred embodiment and the third comparative example are illustrated in Table 1 below. On the other hand, design parameters of respective acoustic wave resonators of the first bandpass filters in the first comparative example and the second comparative example are illustrated in Table 2 below. Here, in the interdigital transducer electrode, when looking in an acoustic wave propagation direction, the area where the first electrode fingers and the second electrode fingers overlap each other is defined as an intersecting area. The dimension of the intersecting area in a direction orthogonal or substantially orthogonal to the acoustic wave propagation direction is defined as an intersecting width. The wavelengths in Table 1 and Table 2 are determined by the electrode finger pitches of the interdigital transducer electrodes.

TABLE 1

|  | SERIES ARM RESONATOR | | | | PARALLEL ARM RESONATOR | | | |
| --- | --- | --- | --- | --- | --- | --- | --- | --- |
|  | S1 | S2 | S3 | S4 | P1 | P2 | P3 | P4 |
| NUMBER OF PAIRS OF ELECTRODE FINGERS OF INTERDIGITAL TRANSDUCER ELECTRODE (PAIRS) | 100 | 110 | 125 | 110 | 50 | 67 | 57 | 62 |
| INTERSECTING WIDTH (μm) | 38 | 37 | 53 | 38 | 39 | 59 | 40 | 48 |
| DUTY OF INTERDIGITAL TRANSDUCER ELECTRODE | 0.57 | 0.57 | 0.57 | 0.57 | 0.57 | 0.57 | 0.57 | 0.57 |
| WAVELENGTH IN INTERDIGITAL TRANSDUCER ELECTRODE (μm) | 1.75 | 1.77 | 1.78 | 1.77 | 1.84 | 1.86 | 1.85 | 1.85 |

TABLE 2

|  | SERIES ARM RESONATOR | | | | PARALLEL ARM RESONATOR | | | |
| --- | --- | --- | --- | --- | --- | --- | --- | --- |
|  | S1 | S2 | S3 | S4 | P1 | P2 | P3 | P4 |
| NUMBER OF PAIRS OF ELECTRODE FINGERS OF INTERDIGITAL TRANSDUCER ELECTRODE (PAIRS) | 100 | 110 | 125 | 110 | 50 | 67 | 57 | 62 |
| INTERSECTING WIDTH (μm) | 38 | 37 | 53 | 38 | 39 | 59 | 40 | 48 |
| DUTY OF INTERDIGITAL TRANSDUCER ELECTRODE | 0.57 | 0.57 | 0.57 | 0.57 | 0.57 | 0.57 | 0.57 | 0.57 |
| WAVELENGTH IN INTERDIGITAL TRANSDUCER ELECTRODE (μm) | 1.75 | 1.77 | 1.78 | 1.77 | 1.85 | 1.86 | 1.85 | 1.85 |

Figure 3:
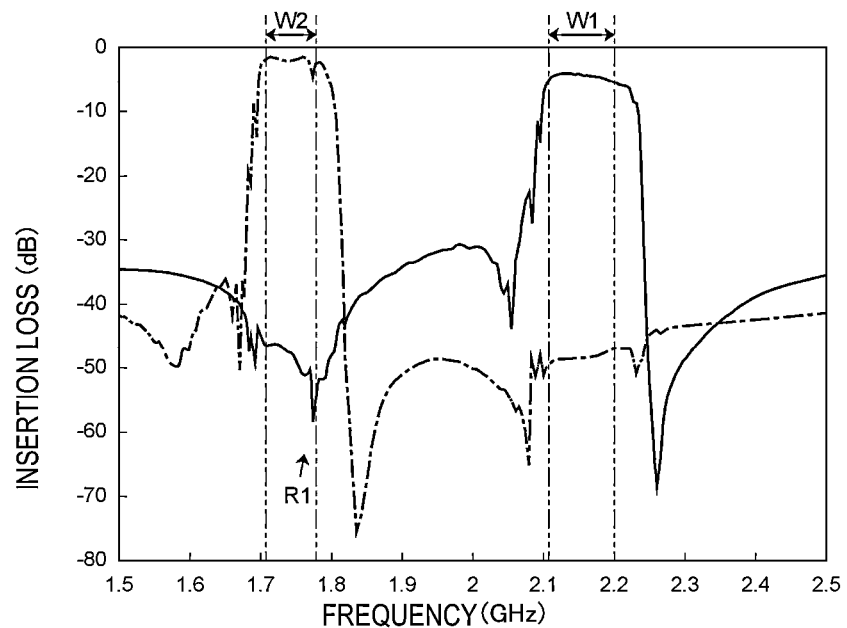
FIG. 3 is a diagram illustrating attenuation frequency characteristics of a filter device according to a first comparative example.

FIG. 3 is a diagram illustrating attenuation frequency characteristics of a filter device according to the first comparative example. The solid line denotes a result of the first bandpass filter, and the dashed-dotted line denotes a result of the second bandpass filter. An arrow R1 in FIG. 3 denotes a response of the Rayleigh wave in the first comparative example. The same applies to drawings other than FIG. 3.

As illustrated in FIG. 3, it was discovered that in the first comparative example, a ripple occurs in a pass band W2 of the second bandpass filter. This ripple occurs at the frequency of the response of the Rayleigh wave denoted by the arrow R1. As described above, the ripple in the pass band W2 of the second bandpass filter is caused by the Rayleigh wave in the first bandpass filter.

Figure 4:
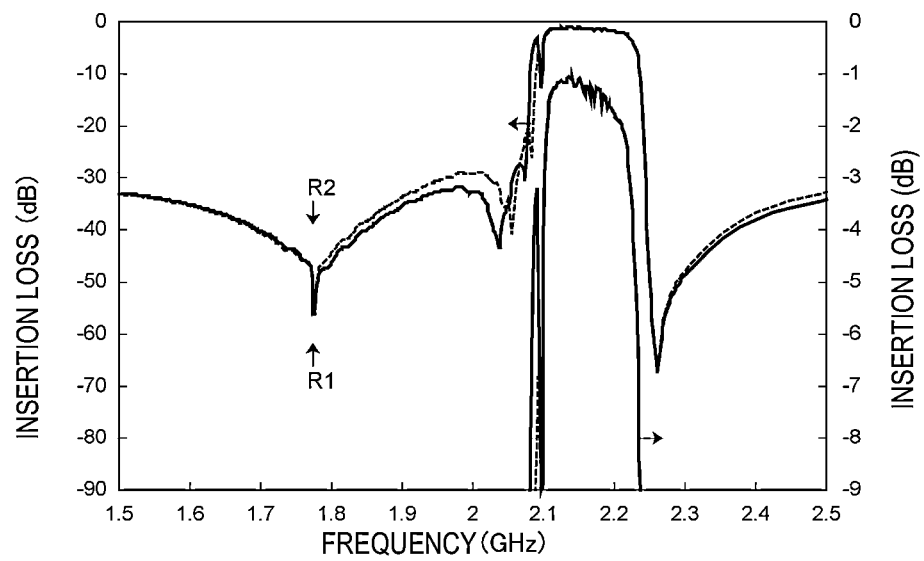
FIG. 4 is a diagram illustrating attenuation frequency characteristics of first bandpass filters in the first comparative example and a second comparative example.

FIG. 4 is a diagram illustrating attenuation frequency characteristics of first bandpass filters in the first comparative example and the second comparative example. In FIG. 4, the solid line denotes a result of the second comparative example, and the dashed line denotes a result of the first comparative example. An arrow R2 denotes a response of the Rayleigh wave in the second comparative example.

As denoted by the arrow R1 and the arrow R2 in FIG. 4, it was discovered that in the first comparative example and the second comparative example, the frequency of the response caused by the Rayleigh wave in the first bandpass filter does not change. Unlike the first comparative example, in the second comparative example, an inductor is connected in series to the parallel arm resonator closest to the common connection terminal. As described above, it was discovered that the frequency of the response caused by the Rayleigh wave does not change by the connection of an inductor to the parallel arm resonator. Note that the frequency of an attenuation pole of the second comparative example is lower than the frequency of an attenuation pole of the first comparative example.

Figure 5:
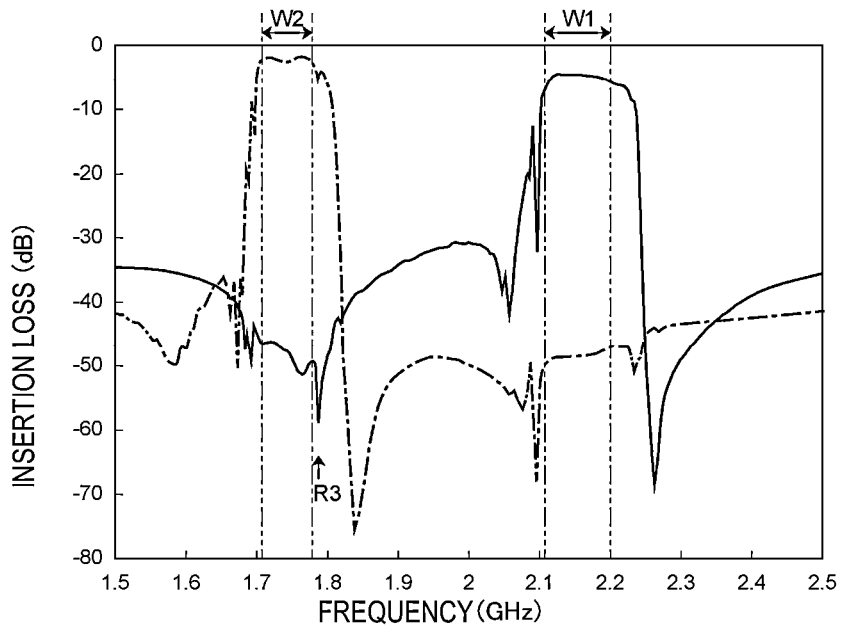
FIG. 5 is a diagram illustrating attenuation frequency characteristics of a filter device according to a third comparative example.

FIG. 5 is a diagram illustrating attenuation frequency characteristics of a filter device according to the third comparative example. The solid line denotes a result of the first bandpass filter, and the dashed-dotted line denotes a result of the second bandpass filter. An arrow R3 denotes a response of the Rayleigh wave in the third comparative example.

As illustrated in FIG. 5, in the third comparative example, the ripple caused by the Rayleigh wave is located outside the pass band W2 of the second bandpass filter. As is the case with the first preferred embodiment, in the third comparative example, the electrode finger pitch of the interdigital transducer electrode in the parallel arm resonator closest to the common connection terminal is shorter than any of the electrode finger pitches of the interdigital transducer electrodes in the other parallel arm resonators of the first bandpass filter. Because of this, the frequency of the response caused by the Rayleigh wave in the first bandpass filter, which is denoted by the arrow R3, is different from that of the first comparative example.

However, in the third comparative example, the insertion loss in the pass band W1 of the first bandpass filter becomes greater than that of the first comparative example illustrated in FIG. 3. More specifically, the insertion loss is about −5.4 dB in the first comparative example, and the insertion loss is about −5.6 dB in the second comparative example. Note that in the present specification, "the insertion loss in a pass band" is defined to mean "the insertion loss whose absolute value is the largest in a pass band". As described above, in the third comparative example, the filter characteristics of the first bandpass filter degrades.

Figure 6:
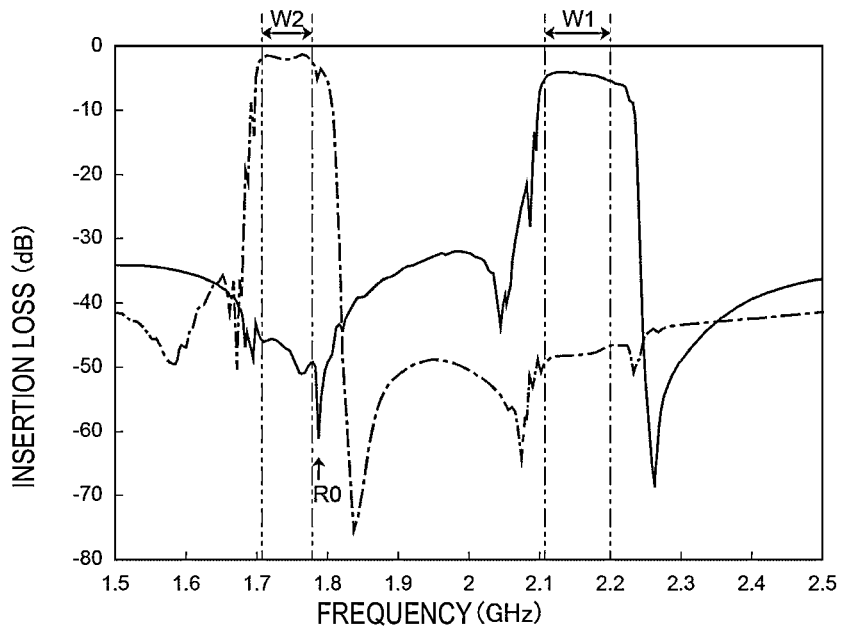
FIG. 6 is a diagram illustrating attenuation frequency characteristics of the filter device according to the first preferred embodiment of the present invention.

FIG. 6 is a diagram illustrating attenuation frequency characteristics of a filter device according to the first preferred embodiment. In FIG. 6, the solid line denotes a result of the first bandpass filter, and the dashed-dotted line denotes a result of the second bandpass filter. An arrow R0 denotes a response of the Rayleigh wave in the first preferred embodiment. The same applies to drawings other than FIG. 6.

As illustrated in FIG. 6, in the first preferred embodiment, the ripple caused by the Rayleigh wave is located outside the pass band W2 of the second bandpass filter. In the first preferred embodiment, the electrode finger pitch of the interdigital transducer electrode in the parallel arm resonator closest to the common connection terminal is shorter than any of the electrode finger pitches of the interdigital transducer electrodes in the other parallel arm resonators of the first bandpass filter. This enables the frequency of the response caused by the Rayleigh wave in the first bandpass filter, which is denoted by the arrow R0, to be different from frequencies in the pass band W2 of the second bandpass filter.

Figure 7:
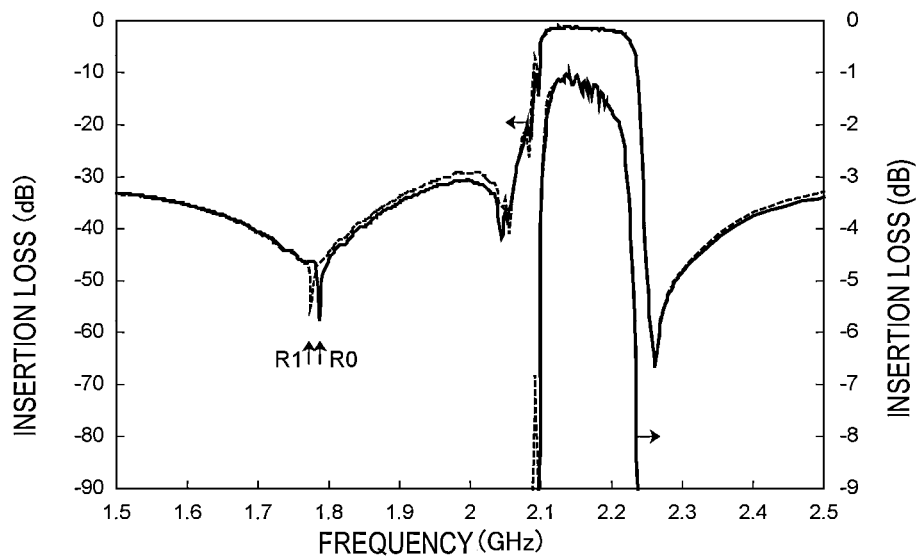
FIG. 7 is a diagram illustrating attenuation frequency characteristics of the first bandpass filters in the first preferred embodiment of the present invention and the first comparative example.
Figure 8:
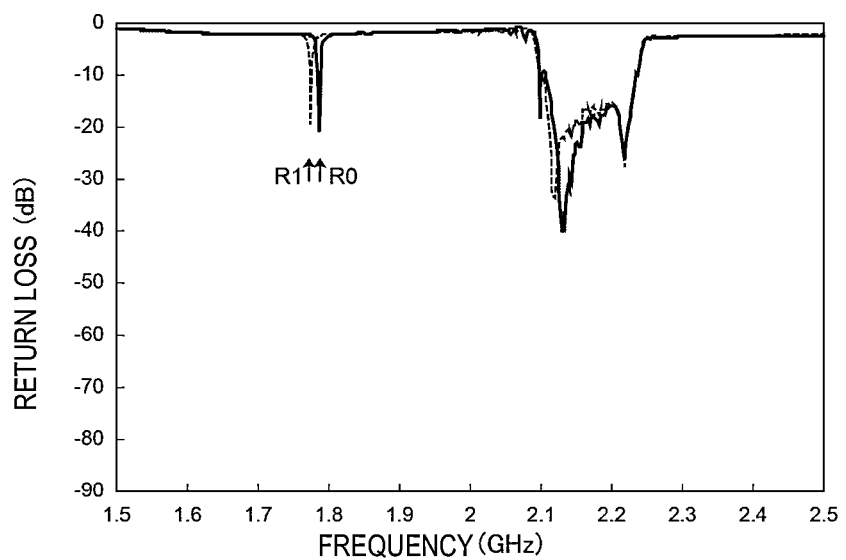
FIG. 8 is a diagram illustrating return losses of the first bandpass filters in the first preferred embodiment of the present invention and the first comparative example.

FIG. 7 is a diagram illustrating attenuation frequency characteristics of the first bandpass filters in the first preferred embodiment and the first comparative example. FIG. 8 is a diagram illustrating the return losses of the first bandpass filters in the first preferred embodiment and the first comparative example. In FIG. 7 and FIG. 8, the solid line denotes a result of the first preferred embodiment, and the dashed line denotes a result of the first comparative example.

As described above, in the first comparative example, the response of the Rayleigh wave occurs in the pass band W2 of the second bandpass filter. On the other hand, as illustrated in FIG. 7 and FIG. 8, it was discovered that in the first preferred embodiment, the frequency of the response caused by the Rayleigh wave is higher than that of the first comparative example. Accordingly, as described above, it becomes possible to position the ripple caused by the Rayleigh wave outside the pass band W2 of the second bandpass filter.

Returning to FIG. 6, in the first preferred embodiment, the insertion loss of the first bandpass filter is about −5.4 dB. In the first preferred embodiment, the insertion loss of the first bandpass filter is smaller than the insertion loss of the third comparative example and does not degrade as much as the insertion loss of the first comparative example. In the first preferred embodiment, an inductor is connected in series to the parallel arm resonator with the shortest electrode finger pitch of the interdigital transducer electrode. This enables reduction or prevention of the insertion loss degradation. As described above, in the first preferred embodiment, it becomes possible to reduce or prevent an effect of the response caused by the Rayleigh wave on the pass band W2 of the second bandpass filter without causing degradation of the filter characteristics of the first bandpass filter.

Note that as illustrated in FIG. 4 and FIG. 7, compared with the second comparative example, in the first preferred embodiment, an attenuation pole of the first bandpass filter is higher in frequency and thus closer to the pass band W1 of the first bandpass filter. This enables reduction or prevention of the steepness degradation in the vicinity of an end portion of the pass band W1. In the present specification, "the steepness is high" is defined to mean that "for a certain change in attenuation, a change in frequency is smaller in the vicinity of an end portion of a pass band".

Of effects of unwanted waves of the first bandpass filter 1 on the second bandpass filter 2 connected in common, which are illustrated in FIG. 1, the effect of the unwanted wave of the acoustic wave resonator closest to the common connection terminal is the largest. It is preferable that, as in the present preferred embodiment, in the first bandpass filter 1, the electrode finger pitch of the interdigital transducer electrode 7 in the parallel arm resonator P1 closest to the common connection terminal 3 is the shortest. This enables further reduction or prevention of the effect of the response caused by the Rayleigh wave on the second bandpass filter 2.

In the first preferred embodiment, the inductor L is connected in series to the ground potential side of the parallel arm resonator P1. Note that the inductor L only needs to be connected in series to the parallel arm resonator with the shortest electrode finger pitch of the interdigital transducer electrode. As examples of such a case, a first modified example and a second modified example of the first preferred embodiment are described below. As is the case with the first preferred embodiment, in the first modified example and the second modified example, it also becomes possible to reduce or prevent the effect of the response caused by the Rayleigh wave on the pass band of the second bandpass filter without causing degradation of the filter characteristics of the first bandpass filter.

Figure 9:
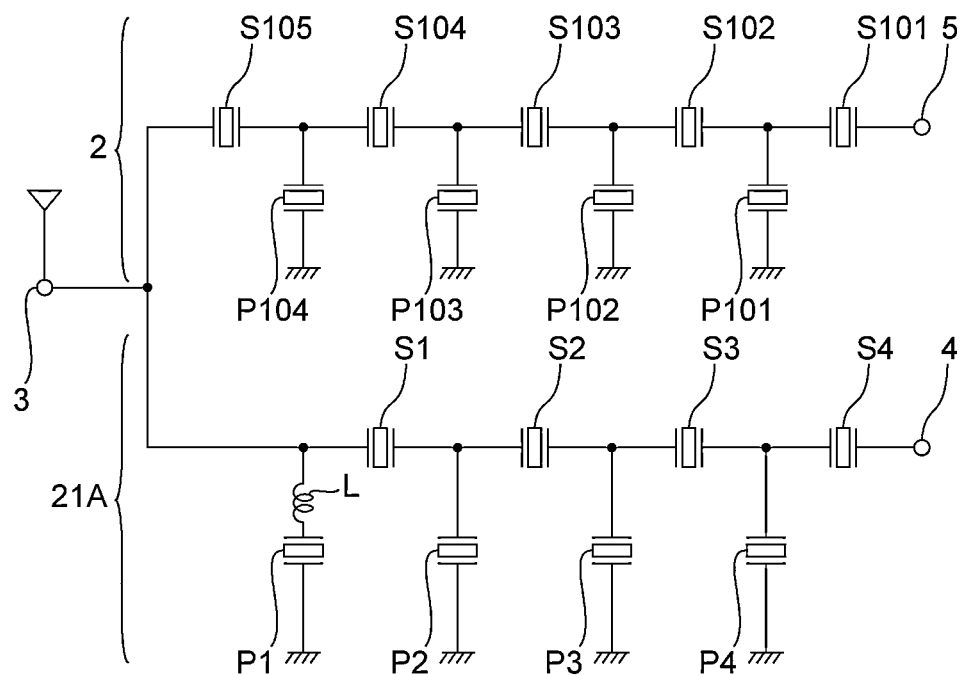
FIG. 9 is a circuit diagram of a filter device according to a first modified example of the first preferred embodiment of the present invention.

In a first bandpass filter 21A in the first modified example illustrated in FIG. 9, an inductor L is connected in series to the common connection terminal 3 side of the parallel arm resonator P1. Note that the inductor L is not connected between the series arm resonator S1 and the common connection terminal 3. More specifically, the inductor L is connected between the parallel arm resonator P1 and a connection point between the common connection terminal 3 and the series arm resonator S1, to which the parallel arm resonator P1 is connected.

Figure 10:
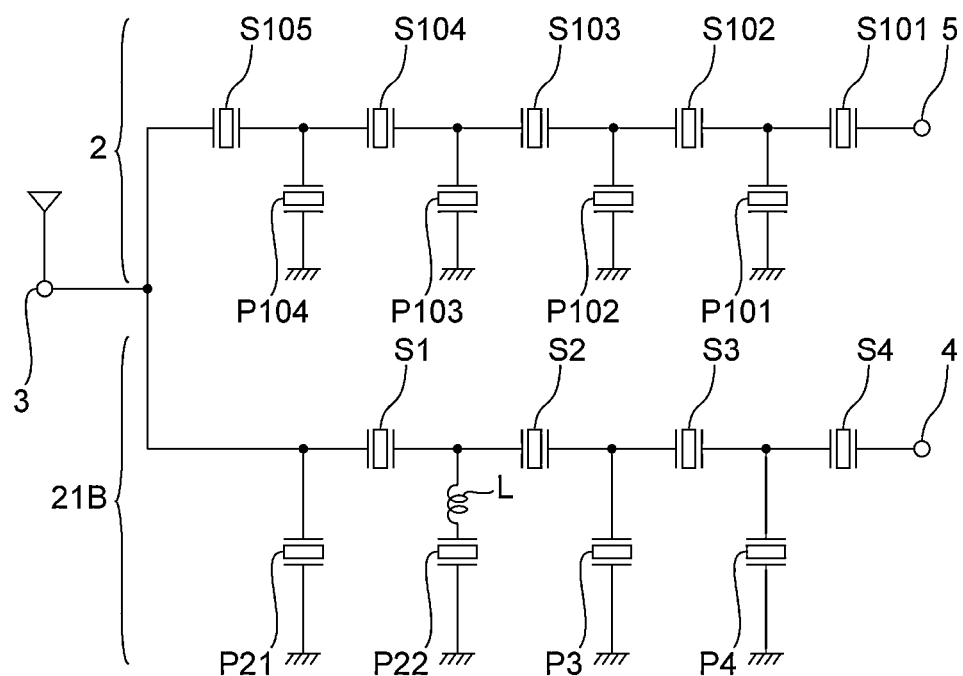
FIG. 10 is a circuit diagram of a filter device according to a second modified example of the first preferred embodiment of the present invention.

In a first bandpass filter 21B in the second modified example illustrated in FIG. 10, a parallel arm resonator P22 with the shortest electrode finger pitch of the interdigital transducer electrode 7 is the second closest parallel arm resonator to the common connection terminal 3. An inductor L is connected between the parallel arm resonator P22 and a connection point between the series arm resonator S1 and the series arm resonator S2. Note that no inductor is connected to a parallel arm resonator P21 closest to the common connection terminal 3. As described above, the position of the parallel arm resonator P22 with the shortest electrode finger pitch of the interdigital transducer electrode 7 is not limited to a particular position. However, as described above, it is preferable that the parallel arm resonator P22 with the shortest electrode finger pitch of the interdigital transducer electrode 7 is closest to the common connection terminal 3.

In the first preferred embodiment, the piezoelectric substrate 6 includes only a piezoelectric layer. Note that the piezoelectric substrate is not limited to this and may alternatively be a multilayer body. The filter device may be any filter device as long as the filter device uses an SH wave. Below, third to fifth modified examples of the first preferred embodiment, in which only the configuration of the piezoelectric substrate is different from the first preferred embodiment, are described. As is the case with the first preferred embodiment, in the third to fifth modified examples, it also becomes possible to reduce or prevent the effect of the response caused by the Rayleigh wave on the pass band of the second bandpass filter without causing degradation of the filter characteristics of the first bandpass filter.

Figure 11:
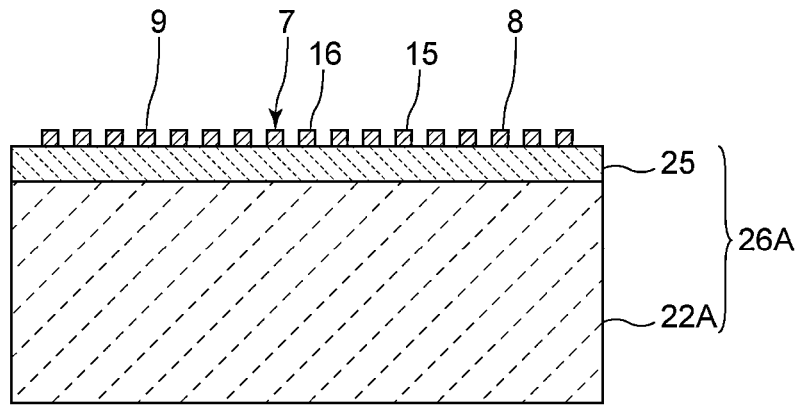
FIG. 11 is a front cross-sectional view of an acoustic wave resonator in a third modified example of the first preferred embodiment of the present invention.

In the third modified example illustrated in FIG. 11, a piezoelectric substrate 26A includes a high acoustic velocity material layer and a piezoelectric layer 25 provided on the high acoustic velocity material layer. In the case where the piezoelectric layer 25 is a lithium tantalate layer whose Euler angles are (0°±5°, θ, 0°±5°) where θ is about −54° to about −42°, SH waves are dominantly excited. The high acoustic velocity material layer has a relatively higher acoustic velocity. More specifically, the acoustic velocity of bulk waves propagating through the high acoustic velocity material layer is higher than the acoustic velocity of acoustic waves propagating through the piezoelectric layer 25. In the present modified example, the high acoustic velocity material layer is a high acoustic velocity support substrate 22A. The piezoelectric layer 25 is provided directly on the high acoustic velocity support substrate 22A.

As the material of the high acoustic velocity support substrate 22A, for example, a medium whose main component is one of the following materials can be used: aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, a DLC (diamond like carbon) film, diamond, or the like.

As in the present modified example, in the case where the piezoelectric substrate 26A is the multilayer body including the piezoelectric layer 25 and the high acoustic velocity material layer, the material of the piezoelectric layer 25 is not limited to lithium tantalate. The material of the piezoelectric layer 25 may alternatively be, for example, lithium niobate or the like.

In the present modified example, the piezoelectric substrate 26A has a multilayer structure in which the high acoustic velocity material layer and the piezoelectric layer 25 are stacked on top of each other, and this enables acoustic wave energy in the piezoelectric layer 25 side to be effectively confined.

Figure 12:
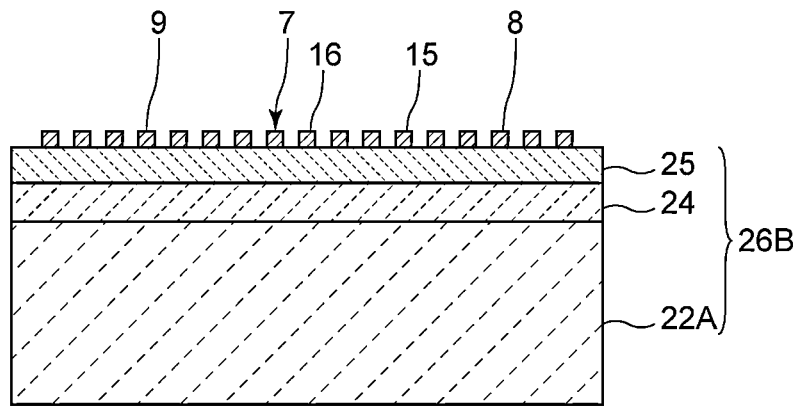
FIG. 12 is a front cross-sectional view of an acoustic wave resonator in a fourth modified example of the first preferred embodiment of the present invention.

In the fourth modified example illustrated in FIG. 12, a piezoelectric substrate 26B includes the high acoustic velocity support substrate 22A, a low acoustic velocity film 24 provided on the high acoustic velocity support substrate 22A, and the piezoelectric layer 25 provided on the low acoustic velocity film 24. The low acoustic velocity film 24 has a relatively lower acoustic velocity. More specifically, the acoustic velocity of bulk waves propagating through the low acoustic velocity film 24 is lower than the acoustic velocity of bulk waves propagating through the piezoelectric layer 25.

As the material of the low acoustic velocity film 24, for example, a medium whose main component is one of the following materials can also be used: silicon oxynitride, tantalum oxide, silicon oxide, a compound formed by adding fluorine, carbon, or boron to silicon oxide, or any other similar material.

In the present modified example, the piezoelectric substrate 26B has a multilayer structure in which the high acoustic velocity support substrate 22A, the low acoustic velocity film 24, and the piezoelectric layer 25 are stacked on top of each other in this order, and this enables acoustic wave energy in the piezoelectric layer 25 side to be effectively confined.

Figure 13:
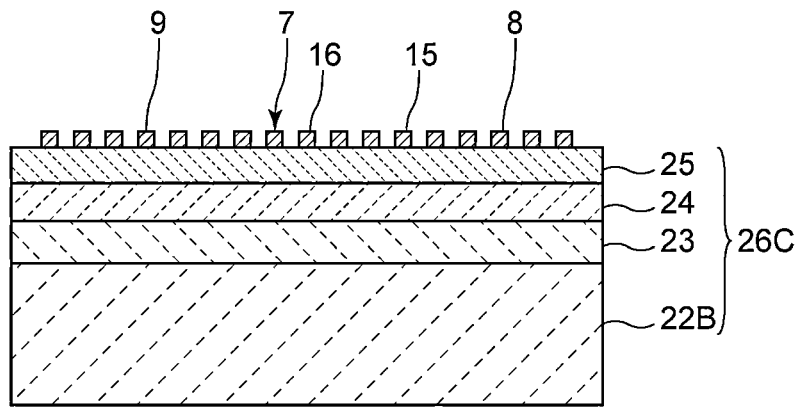
FIG. 13 is a front cross-sectional view of an acoustic wave resonator in a fifth modified example of the first preferred embodiment of the present invention.

In the fifth modified example illustrated in FIG. 13, a piezoelectric substrate 26C includes a support substrate 22B, a high acoustic velocity material layer provided on the support substrate 22B, the low acoustic velocity film 24 provided on the high acoustic velocity material layer, and the piezoelectric layer 25 provided on the low acoustic velocity film 24. In the present modified example, the high acoustic velocity material layer is a high acoustic velocity film 23.

The piezoelectric layer 25 is provided indirectly on the high acoustic velocity film 23 with the low acoustic velocity film 24 interposed therebetween. In the case where the high acoustic velocity material layer is the high acoustic velocity film 23, the support substrate 22B may not need to have a relatively higher acoustic velocity.

As the material of the high acoustic velocity film 23, for example, a medium whose main component is one of the following materials can be used: aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, a DLC film, diamond, or the like.

As the material of the support substrate 22B, for example, a piezoelectric substance such as aluminum oxide, lithium tantalate, lithium niobate, crystal, or the like, various ceramics such as alumina, magnesia, silicon nitride, aluminum nitride, silicon carbide, zirconia, cordierite, mullite, steatite, forsterite, or the like, a dielectric substance such as sapphire, diamond, glass, or the like, a semiconductor such as silicon, gallium nitride, or the like, or resin or the like can be used.

In the present modified example, the piezoelectric substrate 26C also has a multilayer structure in which the high acoustic velocity film 23, the low acoustic velocity film 24, and the piezoelectric layer 25 are stacked on top of each other in this order, and this enables acoustic wave energy in the piezoelectric layer 25 side to be effectively confined.

Figure 14:
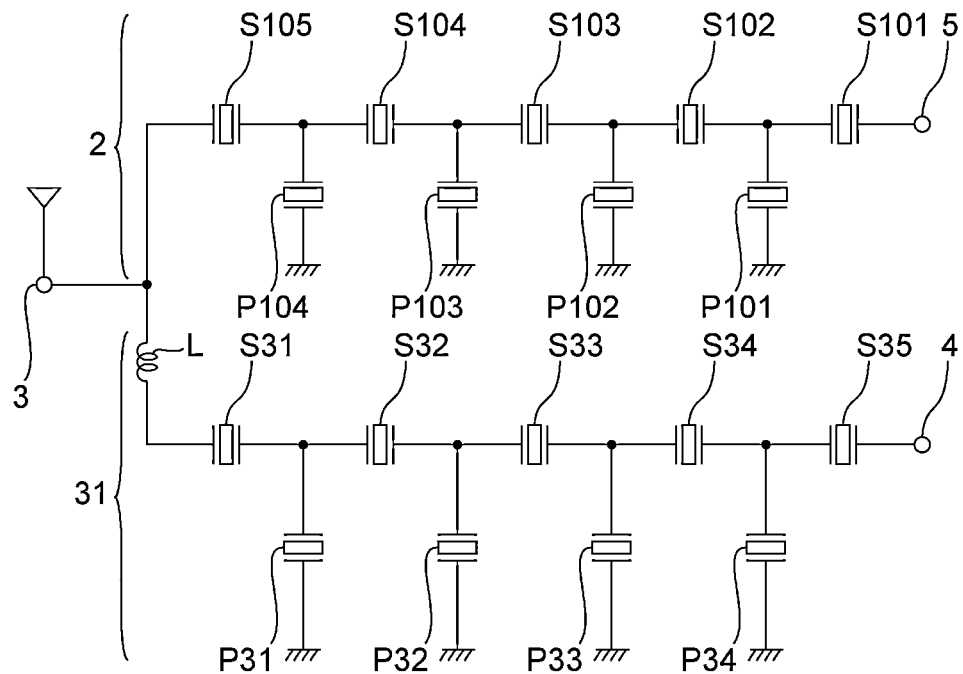
FIG. 14 is a circuit diagram of a filter device according to a second preferred embodiment of the present invention.

FIG. 14 is a circuit diagram of a filter device according to a second preferred embodiment of the present invention.

The present preferred embodiment is different from the first preferred embodiment in the configuration of a first bandpass filter 31. With regard to portions other than the above, the filter device of the present preferred embodiment has a configuration the same as or similar to the filter device 10 of the first preferred embodiment.

More specifically, in the first bandpass filter 31, a series arm resonator S31, a series arm resonator S32, a series arm resonator S33, a series arm resonator S34, and a series arm resonator S35 are connected in series to each other in between the common connection terminal 3 and the first signal terminal 4. Of the plurality of series arm resonators, the series arm resonator S31 is closest to the common connection terminal 3.

A parallel arm resonator P31 is connected between the ground potential and a connection point between the series arm resonator S31 and the series arm resonator S32. A parallel arm resonator P32 is connected between the ground potential and a connection point between the series arm resonator S32 and the series arm resonator S33. A parallel arm resonator P33 is connected between the ground potential and a connection point between the series arm resonator S33 and the series arm resonator S34. A parallel arm resonator P34 is connected between the ground potential and a connection point between the series arm resonator S34 and the series arm resonator S35.

In the present preferred embodiment, the acoustic wave resonator closest to the common connection terminal 3 is the series arm resonator S31. Of electrode finger pitches of interdigital transducer electrodes in the series arm resonators of the first bandpass filter 31, the electrode finger pitch of the interdigital transducer electrode in the series arm resonator S31 closest to the common connection terminal 3 is the shortest. More specifically, the electrode finger pitch of the interdigital transducer electrode in the series arm resonator S31 is shorter than any of the electrode finger pitches of the interdigital transducer electrodes in the other series arm resonators of the first bandpass filter 31. An inductor L is connected in series to the common connection terminal 3 side of the series arm resonator S31. The inductance of the inductor L is preferably, for example, about 1.5 nH in the present preferred embodiment.

A characteristic feature of the present preferred embodiment is that SH waves are used and the inductor L is connected in series to the common connection terminal 3 side of the series arm resonator S31 with the shortest electrode finger pitch of the interdigital transducer electrode, the series arm resonator S31 being one of the plurality of series arm resonators of the first bandpass filter 31. This enables reduction or prevention of the effect of the response caused by the Rayleigh wave on the pass band of the second bandpass filter 2 without causing degradation of the filter characteristics of the first bandpass filter 31. This will be described below by comparing the present preferred embodiment with fourth to sixth comparative examples.

The fourth comparative example is different from the second preferred embodiment in the absence of an inductor and in the electrode finger pitch of the interdigital transducer electrode in the series arm resonator closest to the common connection terminal. The fifth comparative example is different from the second preferred embodiment in the electrode finger pitch of the interdigital transducer electrode in the series arm resonator closest to the common connection terminal. The sixth comparative example is different from the second preferred embodiment in that no inductor is included.

A filter device having the configuration of the second preferred embodiment and filter devices of the fourth to sixth comparative examples are respectively prepared. Conditions of the respective filter devices are as follows.

Communication band: Band 66

Pass band of first bandpass filter: about 2110 MHz to about 2200 MHz

Pass band of second bandpass filter: about 1710 MHz to about 1780 MHz

Material of piezoelectric substrate: Lithium tantalate ($LiTaO_3$)

Euler angles of piezoelectric substrate: (0°±5°, θ, 0°±5°), θ=about −54° to about −42°

The inductances of the inductors in the second preferred embodiment and the fifth comparative example are each set to about 1.5 nH.

Design parameters of respective acoustic wave resonators of the first bandpass filters in the second preferred embodiment and the sixth comparative example are illustrated in Table 3 below. On the other hand, design parameters of respective acoustic wave resonators of the first bandpass filters in the fourth comparative example and the fifth comparative example are illustrated in Table 4 below.

TABLE 3

| | SERIES ARM RESONATOR | | | | | PARALLEL ARM RESONATOR | | | |
|---|---|---|---|---|---|---|---|---|---|
| | S31 | S32 | S33 | S34 | S35 | P31 | P32 | P33 | P34 |
| NUMBER OF PAIRS OF ELECTRODE FINGERS OF INTERDIGITAL TRANSDUCER ELECTRODE (PAIRS) | 165 | 100 | 110 | 125 | 110 | 50 | 67 | 57 | 62 |
| INTERSECTING WIDTH (μm) | 71 | 38 | 37 | 53 | 38 | 39 | 59 | 40 | 48 |
| DUTY OF INTERDIGITAL TRANSDUCER ELECTRODE | 0.57 | 0.57 | 0.57 | 0.57 | 0.57 | 0.57 | 0.57 | 0.57 | 0.57 |
| WAVELENGTH IN INTERDIGITAL TRANSDUCER ELECTRODE (μm) | 1.74 | 1.75 | 1.77 | 1.78 | 1.77 | 1.85 | 1.86 | 1.85 | 1.85 |

TABLE 4

| | SERIES ARM RESONATOR | | | | | PARALLEL ARM RESONATOR | | | |
|---|---|---|---|---|---|---|---|---|---|
| | S31 | S32 | S33 | S34 | S35 | P31 | P32 | P33 | P34 |
| NUMBER OF PAIRS OF ELECTRODE FINGERS OF INTERDIGITAL TRANSDUCER ELECTRODE (PAIRS) | 165 | 100 | 110 | 125 | 110 | 50 | 67 | 57 | 62 |
| INTERSECTING WIDTH (μm) | 71 | 38 | 37 | 53 | 38 | 39 | 59 | 40 | 48 |
| DUTY OF INTERDIGITAL TRANSDUCER ELECTRODE | 0.57 | 0.57 | 0.57 | 0.57 | 0.57 | 0.57 | 0.57 | 0.57 | 0.57 |
| WAVELENGTH IN INTERDIGITAL TRANSDUCER ELECTRODE (μm) | 1.75 | 1.75 | 1.77 | 1.78 | 1.77 | 1.85 | 1.86 | 1.85 | 1.85 |

Figure 15:
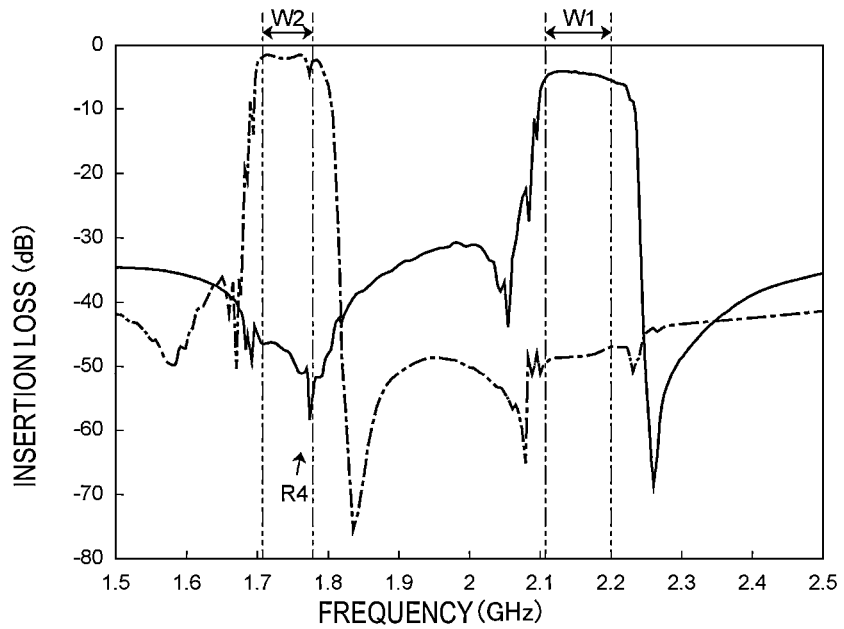
FIG. 15 is a diagram illustrating attenuation frequency characteristics of a filter device according to a fourth comparative example.

FIG. 15 is a diagram illustrating attenuation frequency characteristics of the filter device according to the fourth comparative example. The solid line denotes a result of the first bandpass filter, and the dashed-dotted line denotes a result of the second bandpass filter. An arrow R4 denotes a response of the Rayleigh wave in the fourth comparative example. The same applies to drawings other than FIG. 15.

As illustrated in FIG. 15, it was discovered that in the fourth comparative example, a ripple occurs in the pass band W2 of the second bandpass filter. This ripple is at the frequency of the response of the Rayleigh wave denoted by the arrow R4. As described above, the ripple in the pass band W2 of the second bandpass filter is caused by the Rayleigh wave in the first bandpass filter.

Figure 16:
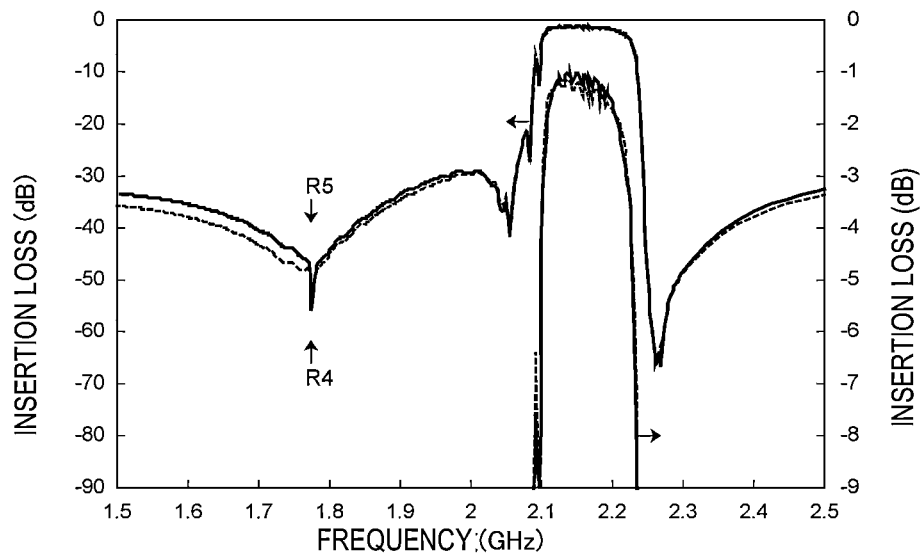
FIG. 16 is a diagram illustrating attenuation frequency characteristics of first bandpass filters in the fourth comparative example and a fifth comparative example.

FIG. 16 is a diagram illustrating attenuation frequency characteristics of the first bandpass filters in the fourth comparative example and the fifth comparative example. In FIG. 16, the solid line denotes a result of the fifth comparative example, and the dashed line denotes a result of the fourth comparative example. An arrow R5 denotes a response of the Rayleigh wave in the fifth comparative example.

As denoted by the arrow R4 and the arrow R5 in FIG. 16, it was discovered that in the fourth comparative example and the fifth comparative example, the frequency of the response caused by the Rayleigh wave in the first bandpass filter does not change. Unlike the fourth comparative example, in the fifth comparative example, an inductor is connected in series to the common connection terminal side of the series arm resonator closest to the common connection terminal. As described above, it was discovered that the frequency of the response caused by the Rayleigh wave does not change by the connection of the inductor to the series arm resonator.

Figure 17:
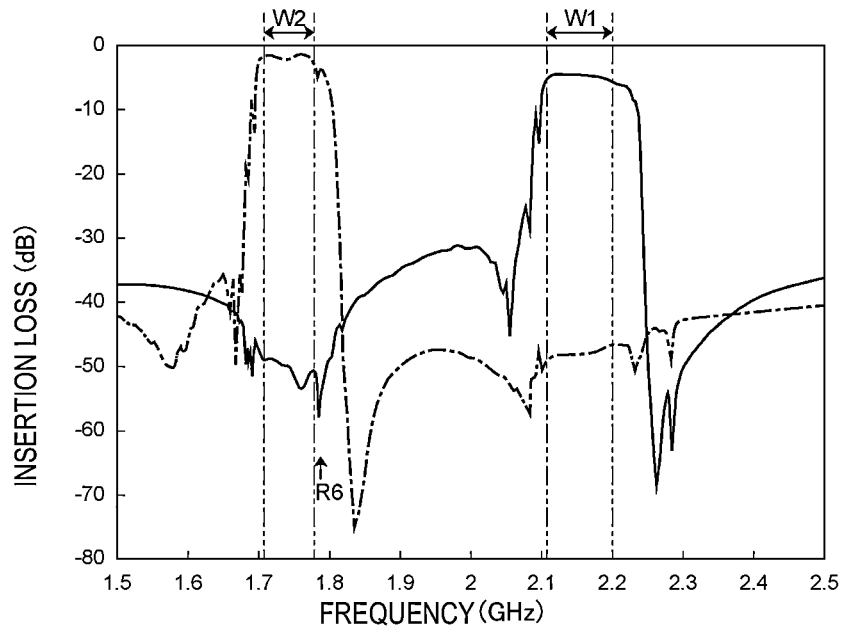
FIG. 17 is a diagram illustrating attenuation frequency characteristics of a filter device according to a sixth comparative example.

FIG. 17 is a diagram illustrating attenuation frequency characteristics of the filter device according to the sixth comparative example. The solid line denotes a result of the first bandpass filter, and the dashed-dotted line denotes a result of the second bandpass filter. An arrow R6 denotes a response of the Rayleigh wave in the sixth comparative example.

As illustrated in FIG. 17, in the sixth comparative example, the ripple caused by the Rayleigh wave is located outside the pass band W2 of the second bandpass filter. As is the case with the second preferred embodiment, in the sixth comparative example, the electrode finger pitch of the interdigital transducer electrode in the series arm resonator closest to the common connection terminal is shorter than any of the electrode finger pitches of the interdigital transducer electrodes in the other series arm resonators of the first bandpass filter. Accordingly, the frequency of the response caused by the Rayleigh wave in the first bandpass filter, which is denoted by the arrow R6, is different from that of the fourth comparative example.

However, in the sixth comparative example, the insertion loss of the first bandpass filter becomes greater than that of the fourth comparative example illustrated in FIG. 15. More specifically, the insertion loss is about −5.4 dB in the fourth comparative example, and the insertion loss is about −5.5 dB in the sixth comparative example. As described above, in the sixth comparative example, the filter characteristics of the first bandpass filter degrades.

Figure 18:
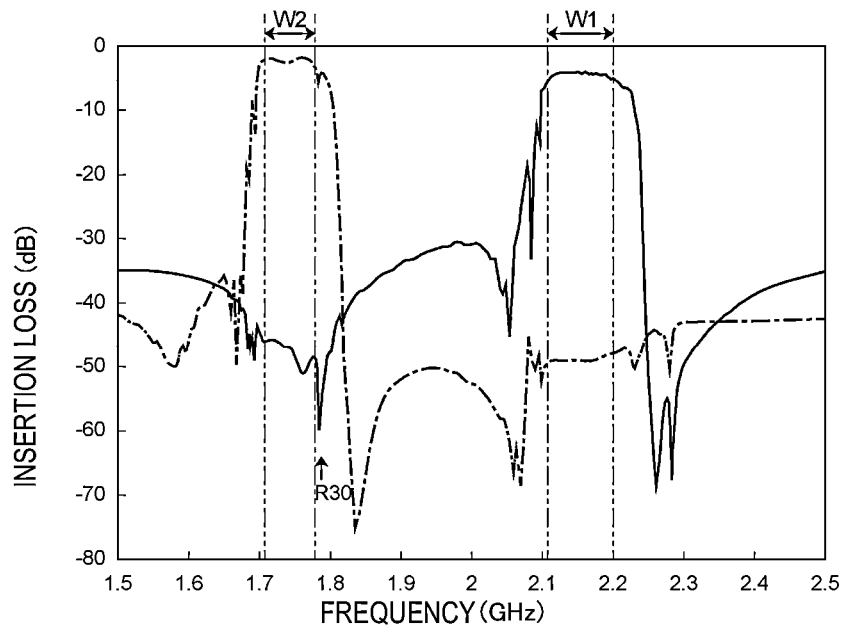
FIG. 18 is a diagram illustrating attenuation frequency characteristics of a filter device according to the second preferred embodiment of the present invention.

FIG. 18 is a diagram illustrating attenuation frequency characteristics of a filter device according to the second preferred embodiment. In FIG. 18, the solid line denotes a result of the first bandpass filter, and the dashed-dotted line denotes a result of the second bandpass filter. An arrow R30 denotes a response of the Rayleigh wave in the second preferred embodiment. The same applies to drawings other than FIG. 18.

As illustrated in FIG. 18, in the second preferred embodiment, the ripple caused by the Rayleigh wave is located outside the pass band W2 of the second bandpass filter. In the second preferred embodiment, the electrode finger pitch of the interdigital transducer electrode in the series arm resonator closest to the common connection terminal is shorter than any of the electrode finger pitches of the interdigital transducer electrodes in the other series arm resonators of the first bandpass filter. This enables the frequency of the response caused by the Rayleigh wave in the first bandpass filter, which is denoted by the arrow R30, to be different from frequencies in the pass band W2 of the second bandpass filter. Note that the electrode finger pitch of an interdigital transducer electrode in a series arm resonator other than the series arm resonator closest to the common connection terminal may alternatively be the shortest.

Figure 19:
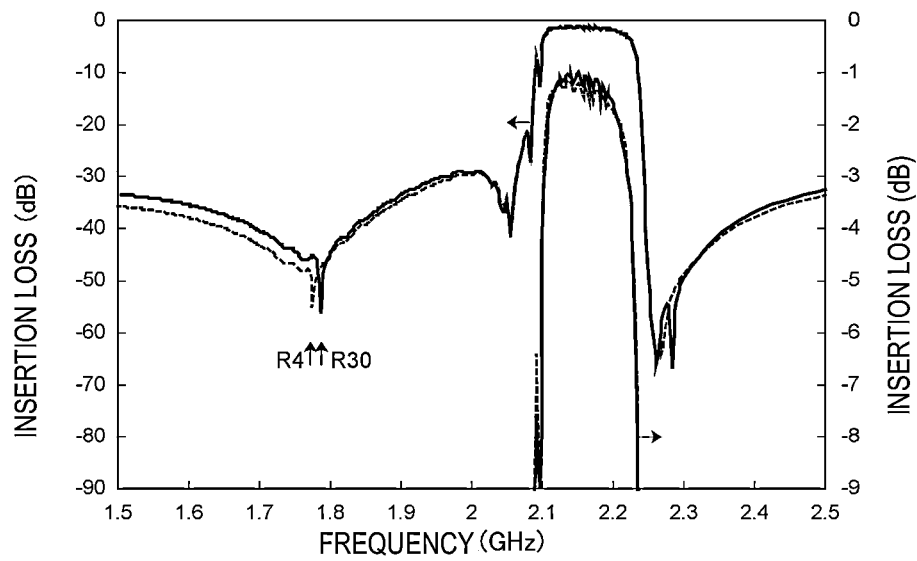
FIG. 19 is a diagram illustrating attenuation frequency characteristics of the first bandpass filters in the second preferred embodiment of the present invention and the fourth comparative example.
Figure 20:
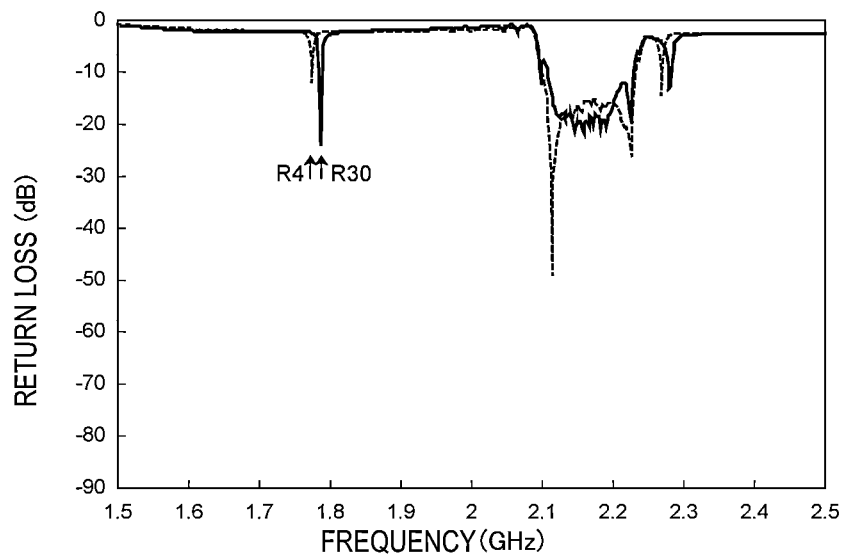
FIG. 20 is a diagram illustrating return losses of the first bandpass filters in the second preferred embodiment of the present invention and the fourth comparative example.

FIG. 19 is a diagram illustrating attenuation frequency characteristics of the first bandpass filters in the second preferred embodiment and the fourth comparative example. FIG. 20 is a diagram illustrating return losses of the first bandpass filters in the second preferred embodiment and the fourth comparative example. In FIG. 19 and FIG. 20, the solid line denotes a result of the second preferred embodiment, and the dashed line denotes a result of the fourth comparative example.

As described above, in the fourth comparative example, the response of the Rayleigh wave occurs in the pass band W2 of the second bandpass filter. On the other hand, as illustrated in FIG. 19 and FIG. 20, it was discovered that in the second preferred embodiment, the frequency of the response caused by the Rayleigh wave becomes higher than that of the fourth comparative example. Accordingly, as described above, it becomes possible to position the ripple caused by the Rayleigh wave outside the pass band W2 of the second bandpass filter.

Returning to FIG. 18, in the second preferred embodiment, the insertion loss in the pass band W1 of the first bandpass filter is about −5.1 dB. In the second preferred embodiment, the insertion loss in the pass band W1 of the first bandpass filter is smaller than the insertion losses of the sixth comparative example and the fourth comparative example. In the second preferred embodiment, an inductor is connected in series to the common connection terminal side of the series arm resonator with the shortest electrode finger pitch of the interdigital transducer electrode. This enables reduction or prevention of the degradation of the insertion loss in the pass band W1. As described above, in the second preferred embodiment, it becomes possible to reduce or prevent the effect of the response caused by the Rayleigh wave on the pass band W2 of the second bandpass filter without causing degradation of the filter characteristics of the first bandpass filter.

As is the case with the present preferred embodiment illustrated in FIG. 14, it is preferable that in the first bandpass filter 31, the electrode finger pitch of the interdigital transducer electrode 7 in the series arm resonator S31 closest to the common connection terminal 3 is the shortest. This enables to further reduction or prevention of the effect of the response caused by the Rayleigh wave on the second bandpass filter 2.

Note that the inductor L only needs to be connected in series to the common connection terminal side of the series arm resonator with the shortest electrode finger pitch of the interdigital transducer electrode. As an example of such a case, a modified example of the second preferred embodiment is described below.

Figure 21:
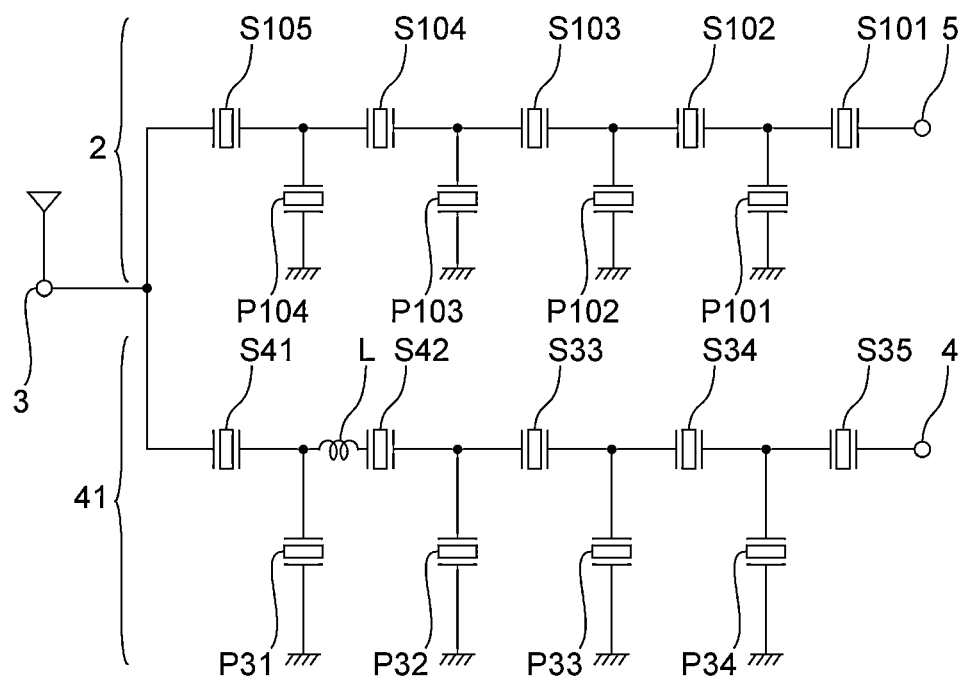
FIG. 21 is a circuit diagram of a filter device according to a modified example of the second preferred embodiment of the present invention.

In a first bandpass filter 41 in the modified example illustrated in FIG. 21, a series arm resonator S42 with the shortest electrode finger pitch of the interdigital transducer electrode is the second closest series arm resonator to the common connection terminal 3. An inductor L is connected in series to the common connection terminal 3 side of the series arm resonator S42. More specifically, the inductor L is connected between the series arm resonator S42 and a connection point between the series arm resonator S41 and the series arm resonator S42, to which the parallel arm resonator P31 is connected. As described above, the position of the series arm resonator S42 with the shortest electrode finger pitch of the interdigital transducer electrode 7 is not limited to a particular position. However, as described above, it is preferable that the series arm resonator S42 with the shortest electrode finger pitch of the interdigital transducer electrode is closest to the common connection terminal 3.

As is the case with the second preferred embodiment, in the present modified example, it also becomes possible to reduce or prevent the effect of the response caused by the Rayleigh wave on the pass band of the second bandpass filter 2 without causing degradation of the filter characteristics of the first bandpass filter 41.

Figure 22:
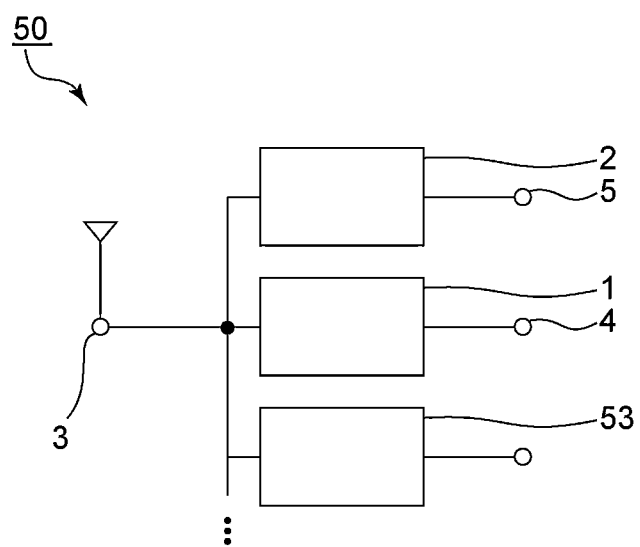
FIG. 22 is a schematic diagram of a filter device according to a third preferred embodiment of the present invention.

FIG. 22 is a schematic diagram of a filter device according to a third preferred embodiment of the present invention.

A filter device 50 of the third preferred embodiment is a multiplexer including three or more bandpass filters connected in common to the common connection terminal 3. More specifically, the filter device 50 includes a first bandpass filter 1, a second bandpass filter 2, and a third bandpass filter 53, which are connected in common to the common connection terminal 3. Note that the first bandpass filter 1 and the second bandpass filter 2 have configurations the same as or similar to those of the first bandpass filter 1 and the second bandpass filter 2 of the first preferred embodiment. On the other hand, the circuit configuration of the third bandpass filter 53 is not limited to a particular configuration.

Even in the case where the filter device 50 is a multiplexer, it only needs to include the first bandpass filter and the second bandpass filter that are the same as or similar to those of the first preferred embodiment, the second preferred embodiment, or any of the modified examples thereof. The number of the bandpass filters connected in common to the common connection terminal 3 is not limited to a particular number. In addition, a bandpass filter or bandpass filters that are different from the first bandpass filter 1, the second bandpass filter 2, and the third bandpass filter 53 are connected to the common connection terminal 3 of the filter device 50 of the present preferred embodiment.

The filter device 50 of the present preferred embodiment includes the first bandpass filter 1 and the second bandpass filter 2 that are the same as or similar to those of the first preferred embodiment. Accordingly, as in the case with the first preferred embodiment, it becomes possible to reduce or prevent the effect of the response caused by the Rayleigh wave on the pass band of the second bandpass filter 2 without causing degradation of the filter characteristics of the first bandpass filter 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a common connection terminal;
   a first bandpass filter connected to the common connection terminal, the first bandpass filter including a piezoelectric substrate, a plurality of acoustic wave resonators on the piezoelectric substrate, and an inductor; and
   a second bandpass filter connected to the common connection terminal, a pass band of the second bandpass filter being lower in frequency than a pass band of the first bandpass filter; wherein
   an SH wave is used;
   the first bandpass filter is a ladder filter including a series arm resonator and a plurality of parallel arm resonators, each of the series arm resonator and the plurality of parallel arm resonators being one of the plurality of acoustic wave resonators and including an interdigital transducer electrode; and
   of the plurality of parallel arm resonators of the first bandpass filter, the inductor is connected in series to the parallel arm resonator with a shortest electrode finger pitch of the interdigital transducer electrode.

2. The filter device according to claim 1, wherein the inductor is connected in series to a common connection terminal side of the parallel arm resonator with the shortest electrode finger pitch of the interdigital transducer electrode.

3. The filter device according to claim 1, wherein the inductor is connected in series to a ground potential side of the parallel arm resonator with the shortest electrode finger pitch of the interdigital transducer electrode.

4. The filter device according to claim 1, wherein of the plurality of acoustic wave resonators, the parallel arm resonator with the shortest electrode finger pitch of the interdigital transducer electrode is closest to the common connection terminal.

5. The filter device according to claim 1, wherein the piezoelectric substrate is a lithium tantalate substrate.

6. The filter device according to claim 1, wherein
   the piezoelectric substrate includes a high acoustic velocity material layer and a piezoelectric layer directly or indirectly on the high acoustic velocity material layer; and
   an acoustic velocity of a bulk wave propagating through the high acoustic velocity material layer is higher than an acoustic velocity of an acoustic wave propagating through the piezoelectric layer.

7. The filter device according to claim 6, wherein the high acoustic velocity material layer is a high acoustic velocity support substrate.

8. The filter device according to claim 6, wherein
   the piezoelectric substrate further includes a support substrate; and
   the high acoustic velocity material layer is a high acoustic velocity film between the support substrate and the piezoelectric layer.

9. The filter device according to claim 6, wherein
   the piezoelectric substrate further includes a low acoustic velocity film between the high acoustic velocity material layer and the piezoelectric layer; and
   an acoustic velocity of a bulk wave propagating through the low acoustic velocity film is lower than an acoustic velocity of a bulk wave propagating through the piezoelectric layer.

10. The filter device according to claim 1, further comprising:
    at least one bandpass filter connected in common to the common connection terminal, together with the first bandpass filter and the second bandpass filter.

11. A filter device comprising:
    a common connection terminal;
    a first bandpass filter connected to the common connection terminal, the first bandpass filter including a piezoelectric substrate, a plurality of acoustic wave resonators on the piezoelectric substrate, and an inductor; and
    a second bandpass filter connected to the common connection terminal, a pass band of the second bandpass filter being lower in frequency than a pass band of the first bandpass filter; wherein
    an SH wave is used;
    the first bandpass filter is a ladder filter including a parallel arm resonator and a plurality of series arm resonators, each of the plurality of series arm resonators and the parallel arm resonator being one of the plurality of acoustic wave resonators and including an interdigital transducer electrode; and
    of the plurality of series arm resonators of the first bandpass filter, the inductor is connected in series to a common connection terminal side of the series arm resonator with a shortest electrode finger pitch of the interdigital transducer electrode.

12. The filter device according to claim 11, wherein of the plurality of acoustic wave resonators, the series arm resonator with the shortest electrode finger pitch of the interdigital transducer electrode is closest to the common connection terminal.

13. A filter device comprising:
    a common connection terminal;
    a first bandpass filter connected to the common connection terminal, the first bandpass filter including a piezoelectric substrate, a plurality of acoustic wave resonators on the piezoelectric substrate, and an inductor; and
    a second bandpass filter connected to the common connection terminal, a pass band of the second bandpass filter being lower in frequency than a pass band of the first bandpass filter; wherein
    the piezoelectric substrate includes a lithium tantalate layer in which θ of Euler angles ($\phi$, $\theta$, $\psi$) is about −54° to about −42°;
    the first bandpass filter is a ladder filter including a parallel arm resonator and a plurality of series arm resonators, each of the plurality of series arm resonators and the parallel arm resonator being one of the plurality of acoustic wave resonators and including an interdigital transducer electrode; and
    of the plurality of series arm resonators of the first bandpass filter, the inductor is connected in series to a common connection terminal side of the series arm resonator with a shortest electrode finger pitch of the interdigital transducer electrode.

14. The filter device according to claim 13, wherein of the plurality of acoustic wave resonators, the series arm resonator with the shortest electrode finger pitch of the interdigital transducer electrode is closest to the common connection terminal.

15. A filter device comprising:
    a common connection terminal;
    a first bandpass filter connected to the common connection terminal, the first bandpass filter including a piezoelectric substrate, a plurality of acoustic wave resonators on the piezoelectric substrate, and an inductor; and
    a second bandpass filter connected to the common connection terminal, a pass band of the second bandpass filter being lower in frequency than a pass band of the first bandpass filter; wherein the piezoelectric substrate includes a lithium tantalate layer in which θ of Euler angles (φ, θ, ψ) is about −54° to about −42°;

the first bandpass filter is a ladder filter including a series arm resonator and a plurality of parallel arm resonators, each of the series arm resonator and the plurality of parallel arm resonators being one of the plurality of acoustic wave resonators and including an interdigital transducer electrode; and of the plurality of parallel arm resonators of the first bandpass filter, the inductor is connected in series to the parallel arm resonator with a shortest electrode finger pitch of the interdigital transducer electrode.

16. The filter device according to claim 15, wherein the inductor is connected in series to a common connection terminal side of the parallel arm resonator with the shortest electrode finger pitch of the interdigital transducer electrode.

17. The filter device according to claim 15, wherein the inductor is connected in series to a ground potential side of the parallel arm resonator with the shortest electrode finger pitch of the interdigital transducer electrode.

18. The filter device according to claim 15, wherein of the plurality of acoustic wave resonators, the parallel arm resonator with the shortest electrode finger pitch of the interdigital transducer electrode is closest to the common connection terminal.

19. The filter device according to claim 15, wherein the piezoelectric substrate is a lithium tantalate substrate.

20. The filter device according to claim 11, wherein the piezoelectric substrate is a lithium tantalate substrate.

* * * * *